(12) United States Patent
Dorfer et al.

(10) Patent No.: US 9,137,919 B2
(45) Date of Patent: Sep. 15, 2015

(54) INVERTER

(75) Inventors: Wolfgang Dorfer, Neuhofen/Krems (AT); Manfred Wiesinger, Bad Wimsbach Neydharting (AT); Sebastian Stempfl, Braunau/Inn (AT); Bernhard Huemer, Schlierbach (AT)

(73) Assignee: Fronius International GmbH, Pettenbach (AT)

( * ) Notice: Subject to any disclaimer, the term of this patent is extended or adjusted under 35 U.S.C. 154(b) by 462 days.

(21) Appl. No.: 13/643,111

(22) PCT Filed: May 31, 2011

(86) PCT No.: PCT/AT2011/000248
§ 371 (c)(1),
(2), (4) Date: Oct. 24, 2012

(87) PCT Pub. No.: WO2011/153564
PCT Pub. Date: Dec. 15, 2011

(65) Prior Publication Data
US 2013/0038993 A1 Feb. 14, 2013

(30) Foreign Application Priority Data
Jun. 8, 2010 (AT) .................................. A 935/2010

(51) Int. Cl.
*H05K 5/02* (2006.01)
*H05K 7/14* (2006.01)
(Continued)

(52) U.S. Cl.
CPC .......... *H05K 7/1432* (2013.01); *H01R 12/7005* (2013.01); *H05K 5/0247* (2013.01); *H05K 7/02* (2013.01); *H05K 7/1469* (2013.01)

(58) Field of Classification Search
CPC ............. H01R 12/7005; H05K 7/1469; H05K 5/0247; H05K 7/02; H05K 7/1432
USPC ............. 361/625, 679.01, 728, 730; 337/196, 337/212
See application file for complete search history.

(56) References Cited

U.S. PATENT DOCUMENTS

| 728,195 | A | * | 5/1903 | Brady ............................. 220/3.8 |
| 1,896,545 | A | * | 2/1933 | Jirka et al. ..................... 337/196 |

(Continued)

FOREIGN PATENT DOCUMENTS

| EP | 0 356 991 | 3/1990 |
| EP | 2 006 988 | 12/2008 |
| WO | WO 98/36462 | 8/1998 |

OTHER PUBLICATIONS

International Search Report of PCT/AT2011/000248, date of mailing Oct. 4, 2011.

*Primary Examiner* — Anatoly Vortman
(74) *Attorney, Agent, or Firm* — Collard & Roe, P.C.

(57) ABSTRACT

An inverter includes an upper and lower housing part and electronic components arranged in the upper and lower housing parts. The components are electrically connected to one another in a releasable manner by means of a contact-making system formed from two parts. In order to produce an electrical and mechanical connection by means of a pivoting movement, the upper housing part is connected to the lower housing part in a manually detachable manner by means of a rotating element which forms an axis of rotation for a circle arc. In the upper and lower housing parts, a part of the contact-making system is respectively arranged along the circle arc in such a way that these parts, during a pivoting movement of the upper housing part relative to the lower housing part into an operating position, can be automatically electrically-connected, with the housing parts connected.

7 Claims, 4 Drawing Sheets

(51) Int. Cl.
*H01R 12/70* (2011.01)
*H05K 7/02* (2006.01)

(56) References Cited

U.S. PATENT DOCUMENTS

| | | | |
|---|---|---|---|
| 1,993,866 A * | 3/1935 | Steinmayer | 337/203 |
| 2,700,712 A * | 1/1955 | Stinson | 337/193 |
| 3,992,654 A * | 11/1976 | Springer et al. | 439/31 |
| 4,178,061 A * | 12/1979 | Ahroni | 439/620.29 |
| 5,007,859 A | 4/1991 | Sangregory et al. | |
| 7,672,115 B2 | 3/2010 | Victor et al. | |
| 7,982,578 B2 * | 7/2011 | Buettner | 337/196 |
| 8,021,171 B2 * | 9/2011 | Buettner | 439/121 |
| 8,830,024 B2 * | 9/2014 | Buettner | 337/215 |
| 2010/0040394 A1 * | 2/2010 | Iijima | 399/107 |
| 2010/0214743 A1 * | 8/2010 | Huang et al. | 361/692 |
| 2011/0209163 A1 * | 8/2011 | Miyagi et al. | 720/600 |
| 2011/0261517 A1 * | 10/2011 | Fuke | 361/679.01 |

* cited by examiner

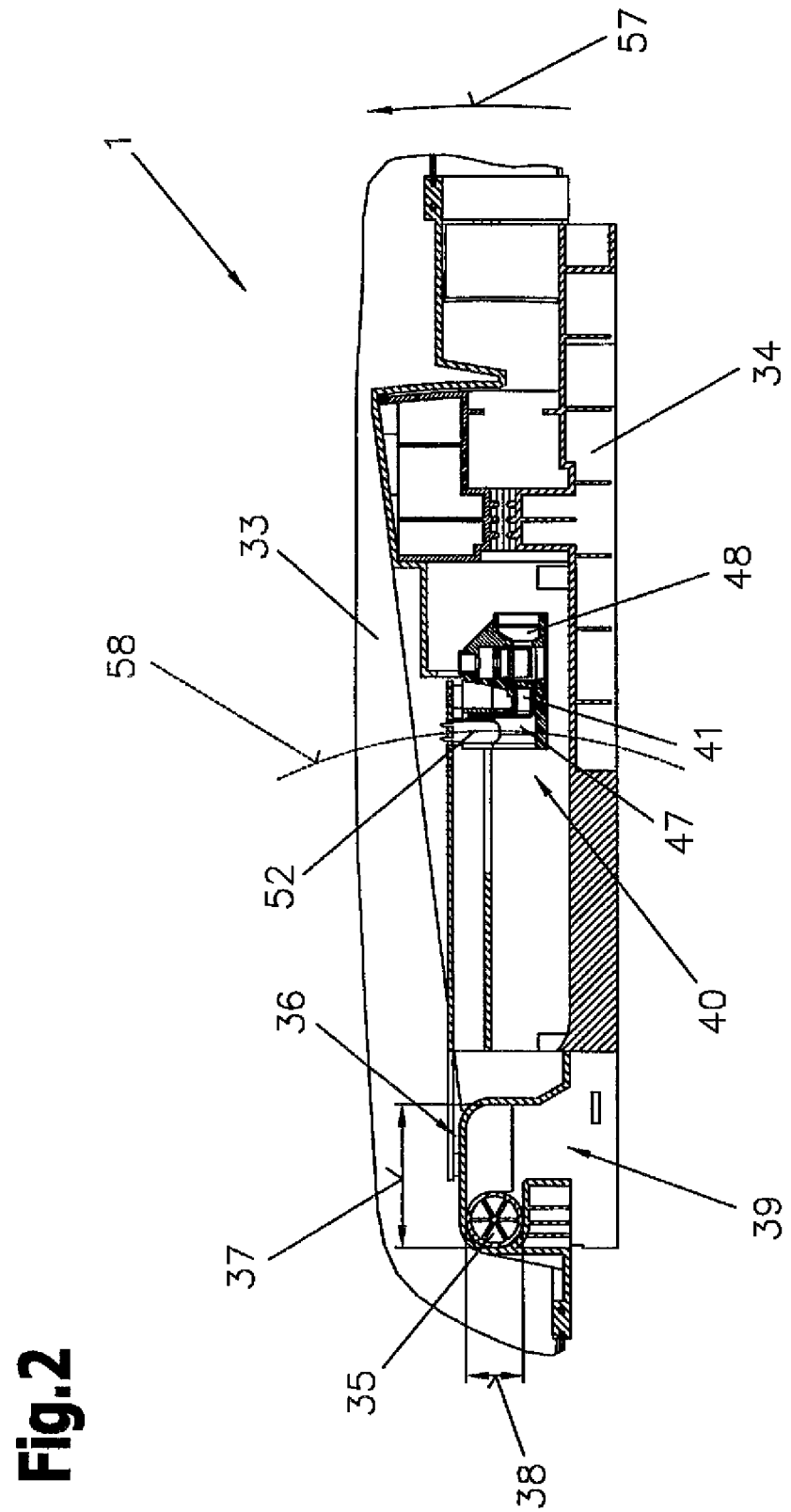

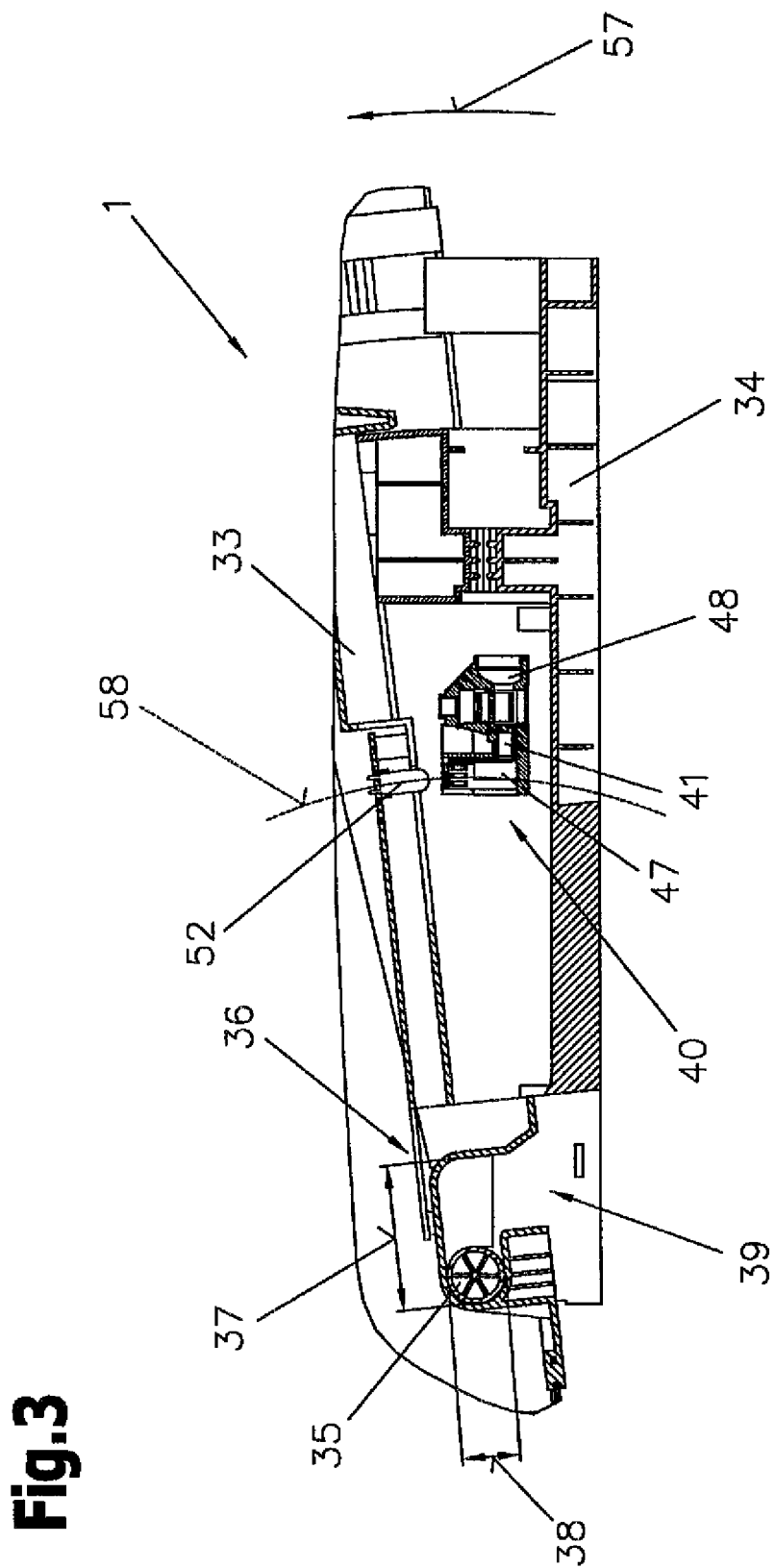

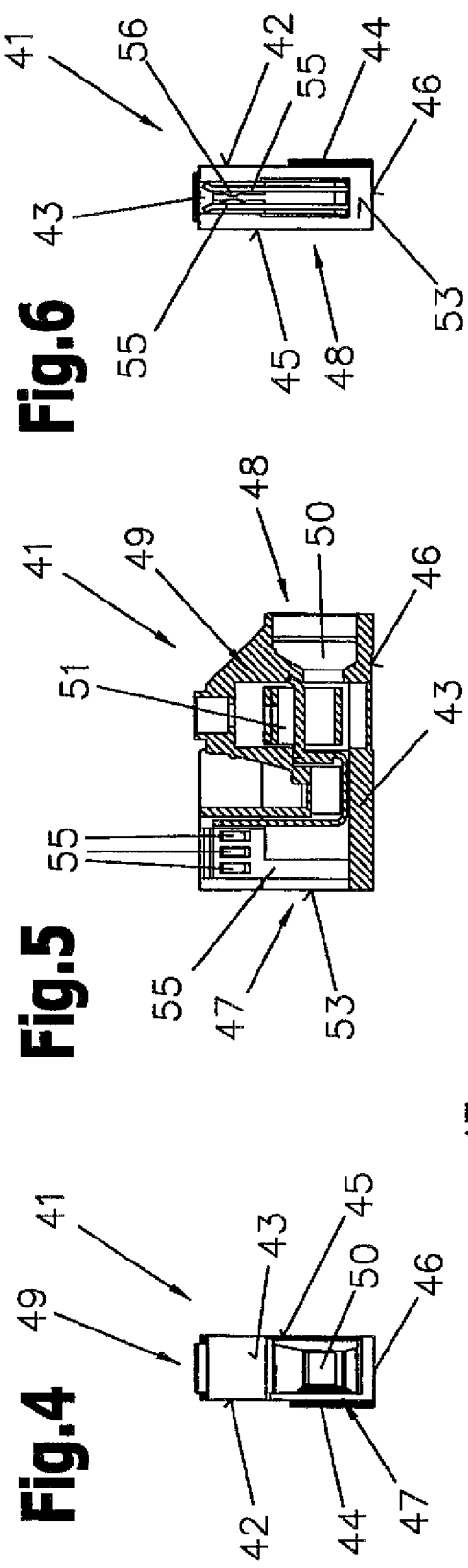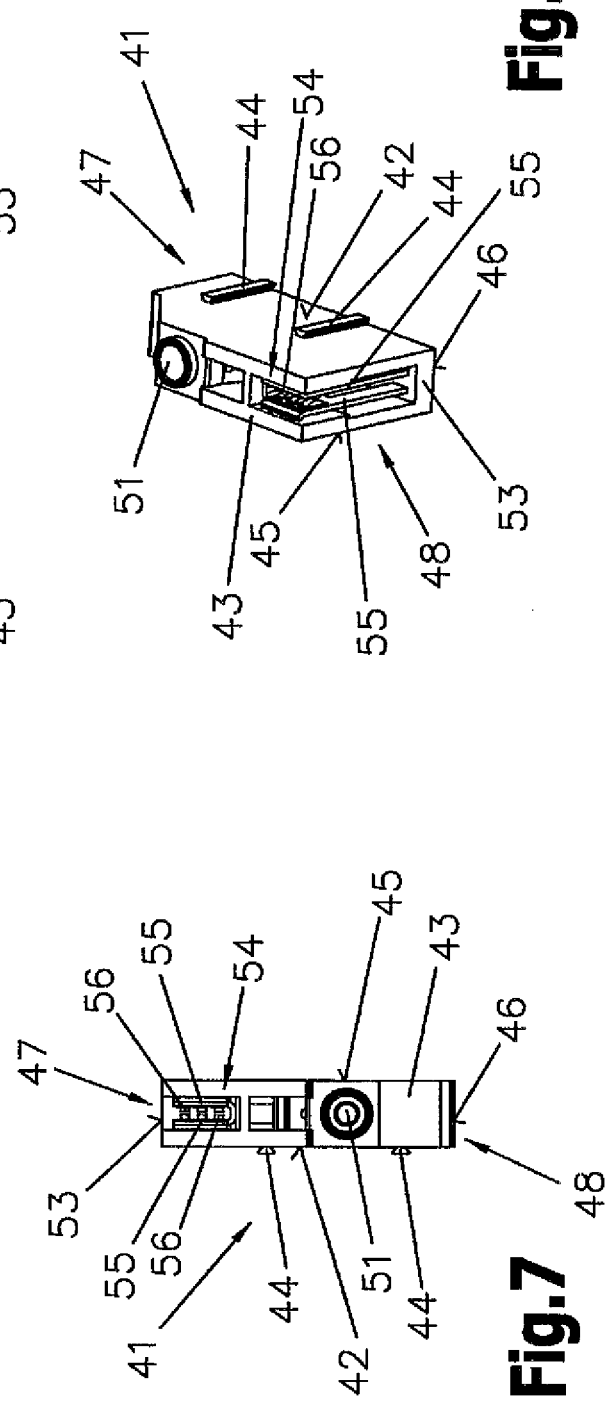

INVERTER

CROSS REFERENCE TO RELATED APPLICATIONS

This application is the National Stage of PCT/AT2011/000248 filed on May 31, 2011, which claims priority under 35 U.S.C. §119 of Austrian Application No. A 935/2010 filed on Jun. 8, 2010, the disclosure of which is incorporated by reference. The international application under PCT article 21(2) was not published in English.

BACKGROUND OF THE INVENTION

1. Field of the Invention

The invention relates to an inverter, comprising an upper and lower housing part, wherein electronic components are arranged in the upper and lower housing parts, said components being electrically connected to one another in a releasable manner by means of a contact-making system formed from two parts.

2. Prior Art

Typically, inverters are formed such that a lower device part or a holder (wall-mounting, stand, etc.) or the entire device is mounted and then the upper housing part is screwed or pushed on top of this lower part.

SUMMARY OF THE INVENTION

It is the object of the invention to create an inverter in which an electrical and mechanical connection of two device parts and/or housing parts or devices is made possible by means of a pivoting movement.

The object of the invention is achieved by the upper housing part being connected to the lower housing part in a manually detachable manner by means of a rotating element, wherein the rotating element forms an axis of rotation for a circle arc, and by parts of the contact-making system being arranged, respectively, in the upper and lower housing parts along the circle arc in such a way that these parts, during a pivoting movement of the upper housing part relative to the lower housing part into an operating position, can be automatically electrically connected, with the housing parts connected. An advantage here is that with the aid of the newly developed components the completed assembly performs the functions of connecting, switching and detaching. In case of additional elements being connected, this assembly can perform the functions of switching and detaching as well. A further advantage is that the installer or user may pre-mount and connect the holder, i. e. the lower housing part. Due to this, only little weight is applied during mounting, since many components are arranged or attached within the upper housing part, which is detached for mounting. This also provides a very good accessibility to the connecting terminals because obstructing components are arranged within the other housing part. During service, the holder or the lower housing part including the electric wires connected to it remains in place, and the device may be replaced quickly as well. Furthermore, the handling of live wires is avoided during service. Due to the special design of the contact-making system and the rotating element, a "flowing" contact is made, and jamming between individual parts is prevented.

Advantageously, the upper housing part comprises a slotted guide track for receiving the rotating element, so the housing part is held and positioned in a simple manner by simply pushing it onto the rotating element.

If the slotted guide track extends in a diameter of the rotating element in the longitudinal direction of the housing for a defined length, whereupon the slotted guide track extends to the outside in an angular manner, thus forming an opening for receiving the rotating element on the upper housing part, a simple guiding may be achieved for aligning the two housing parts with one another.

Advantageously, in the contact-making system, at least one single element with a spring contact is arranged in one housing part or device, and at least one corresponding contact tab of the contact-making system is arranged in the other housing part or device. Thereby, the mechanical attachment and an electrical connection can be made at the same time.

According to one design, a contact element is arranged on one side of a housing of the single element of the contact-making system and a connecting element for a wire, a PCB or a cable is arranged on a different side of the housing, with the contact element and the connecting element being electrically connected to one another. Thereby, a newly developed pivoting contact can be mounted within the lower housing. This contact combination can receive the rotation angle of the pivoting frame, so a contact tab attached to a PCB, for example, may be introduced via a circle arc.

However, a design in which the contact element is formed openly or freely accessible on an opposite side of the connecting element, i.e. on a front face of the housing, is advantageous as well. This makes it possible to introduce the contact tab into the contact element via a portion of the front face, as is necessary in case of a cam track. Thereby, it is guaranteed that the contacts are disconnected when lifting the upper housing part, so the electronic components of the lower housing part are disconnected from the electronic components of the upper housing part by this movement while a mechanical connection of the housing parts remains intact. Actuating the switching or detaching function can be done manually, for example by pulling or pushing, or directly or mechanically pre-stressed (for example spring-loaded) by means of a pivoting lever. A combination of both ways of actuating is possible as well.

Preferably, the contact element is formed by at least one, in particular two, spring contact(s) while a preferably rectangular recess, in particular a slot, is arranged within the housing for arranging the at least one spring contact.

Finally, it is advantageous for the spring contacts to be arranged within the housing in a standing position, i.e. in an angle of substantially 90° to a supporting surface, so the contact tab may be inserted into the contact element from above in a circular trajectory.

BRIEF DESCRIPTION OF THE DRAWINGS

The present invention will be explained in greater detail by means of the attached drawings. In the drawings:

FIG. 2 shows a schematic illustration, partially in section, of an inverter in the operating position with the housing closed;

FIG. 3 shows a schematic illustration, partially in section, of an inverter in an open position, i.e. with upper and lower housing part detached from one another; and FIGS. 4 to 8 show different views of a contact-making system, in particular a single element for the inverter, in a simplified, schematic illustration.

DETAILED DESCRIPTION OF THE INVENTION

Figure 1:
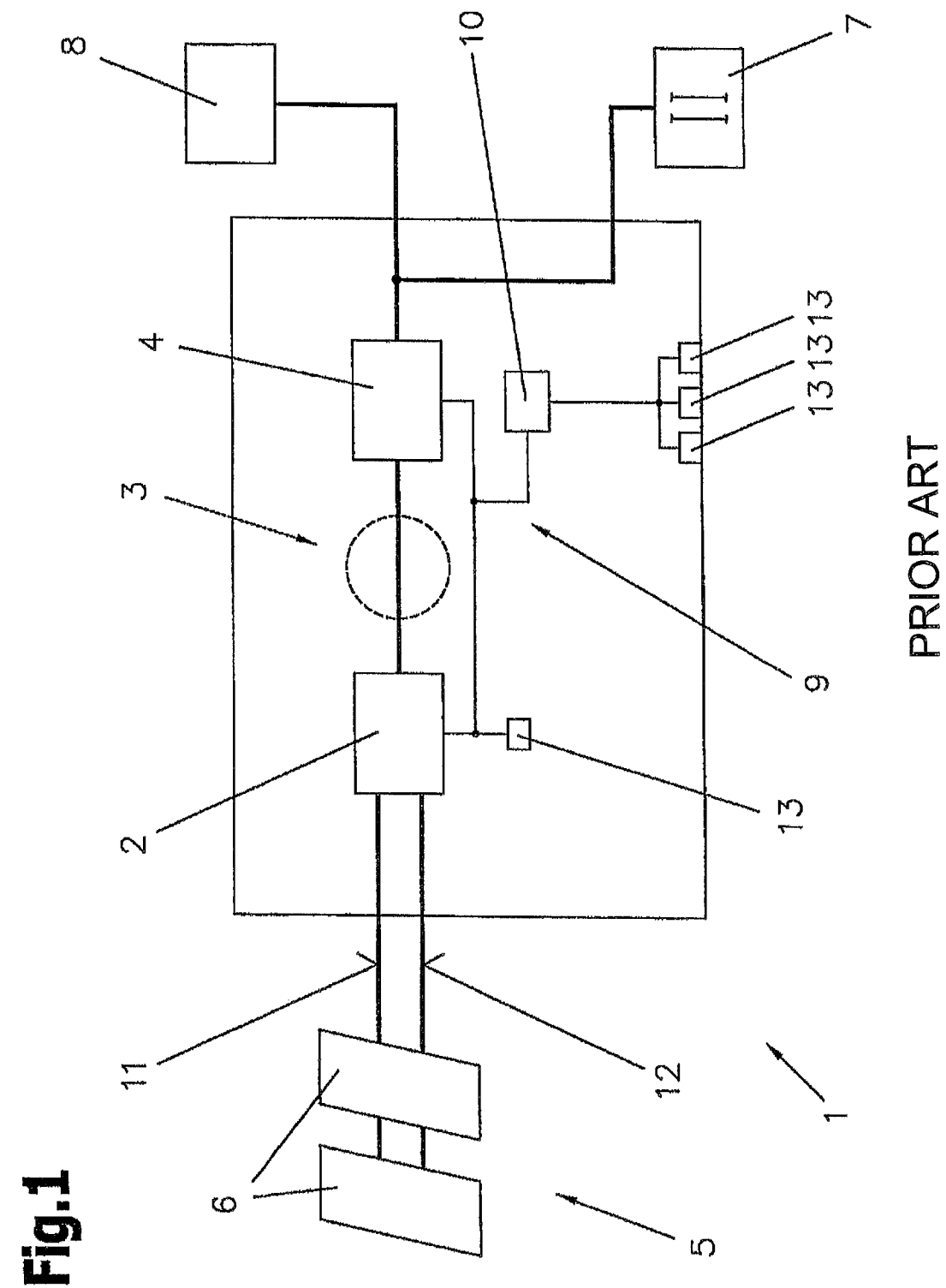
FIG. 1 shows a schematic block diagram of an inverter with components connected thereto.

As an introduction, it should be noted that like parts in the exemplary embodiment shown will be denoted by like reference numerals, and the disclosures in the entire description may be understood to apply analogously to like parts with like reference numerals. Also, the indications of positions chosen in the description, such as up, down, lateral, etc. refer to the directly described and illustrated, figure, and must be transferred to the new position in an analogous manner in case of a change of positions. Furthermore, single features or combinations of features of the exemplary embodiments shown and described may constitute independent or inventive solutions or solutions according to the invention.

FIG. 1 illustrates a design of a known inverter 1, more specifically of an RF inverter. As the individual components and/or assemblies and functions of inverters 1 are already known from the prior art, they will not be dealt with in greater detail hereinafter.

The inverter 1 comprises at least one input DC-DC converter 2, an intermediary circuit 3 and an output DC-AC converter 4. A power source 5, which is preferably formed by one or more solar modules 6 connected in parallel and/or in series, is connected to the input DC-DC converter 2. The inverter 1 and the solar modules 6 are also referred to as photovoltaic system and/or PV system. The output of the inverter 1 and/or the output DC-AC converter 4 may be connected to a supply network 7, such as a public or private AC power network or a multi-phase network and/or at least one electrical load 8. For example, a load 8 may be a motor, a refrigerator, a radio etc., or it may even be a domestic power supply. The individual components of the inverter 1 such as the input DC-DC converter 2 etc. may be connected to a control device 10 via a data bus 9.

Preferably, such an inverter 1 is used as a network-coupled inverter 1, with its power management being optimised to feed as much power as possible into the supply network 7. As is known from the prior art, the loads 8 are energised by the supply network 7. Of course it is possible to use several inverters 1 connected in parallel in order to provide more power for operating the loads 8. This power is supplied by the power source 5, which is connected to the inverter 1 via two connection lines 11, 12, in the form of direct voltage.

The control device 10 or the regulator of the inverter 1 is formed by a microprocessor, a microcontroller or a computer, for example. The control device 10 may be used to control the individual components of the inverter 1, such as the input DC-DC converter 2 or the output DC-AC converter 4, in particular the circuit elements arranged therein. For this, the individual regulating and/or control procedures are stored within the control device 10 in the form of corresponding software programmes and/or data or characteristic curves.

Furthermore, the control device 10 is connected to control elements 13 enabling the user to configure the inverter 1, for example, and/or to display—possibly via LEDs—and set operating modes or parameters. The control elements are connected to the control device 10 by the data bus 9 or directly, for example. Such control elements 13 may be arranged on a front of the inverter 1 in order to be able control it externally. Likewise, the control elements 13 may be arranged directly on assemblies and/or modules within the inverter 1.

In FIGS. 2 and 3, an inverter 1 is shown partially in section in a schematic and simplified view. The inverter comprises an upper housing part 33 and a lower housing part 34, which can be formed in any shape and are not limited to the exemplary embodiment shown. Preferably, at least the control elements 13, which need to receive signals, data and power, are integrated into the upper housing part 33.

In closed or mounted state, i.e. in the operating position according to FIG. 2, the upper and the lower housing part 33, 34 are connected to one another and formed such that their protrusions, edges, etc. engage each other and shut watertight or dust-tight according to the construction of the device (IP class). The upper housing part 33 is hooked to or supported by the lower housing part 34 via a rotating element 35. Accordingly, the rotating element 35 is arranged in the lower housing part 34. For hooking, the upper housing part 33 comprises a slotted guide track 36, i.e. in the region of the rotating element 35 the upper housing part 33 is shaped in such a way that the slotted guide track 36 extends according to a diameter 38 of the rotating element 35 in the longitudinal direction of the housing for a defined length 37 before the slotted guide track 36 extends to the outside in an angular manner, thus forming an opening 39 for receiving the rotating element 35 on the upper housing part 33. The slotted guide track 36 forms a guiding and a holder for the rotating element 35 of the lower housing part 34. Furthermore, a fixing means (not shown) for locking the two housing parts 33, 34 may be arranged on the opposite side of the rotating element 35 and/or the slotted guide track 36. The fixing means may be formed, for example, by a snap connection and/or a mechanical locking mechanism.

The inverter 1 is preferably attached to a wall in a vertical position, wherein the rotating element 35 is arranged in the upper region of the inverter 1 in a substantially horizontal manner. Thus, in an inverter 1 mounted in such a vertical way, the rotating element 35 rests on the slotted guide track 36 when the upper housing part 33 is hooked on. This prevents the upper housing part 33 from falling off the lower housing part 34 when the fixing means is released, as the housing parts are held together via the rotating element 35 and the slotted guide track 36.

As is required with usual constructions of inverters 1, the upper housing part 33 may be detached from the lower housing part 34. The upper housing part 33 is not simply removed from the lower housing part 34 in a straight, i.e. horizontal, fashion as in the prior art, but because of the rotating element 35 accommodated in the slotted guide track 36, as shown in FIG. 3, the upper housing part 33 must be rotated or lifted in relation to the lower housing part 34 by a pivoting movement in the direction of arrow 57. This disengages the individual protrusions and/or wall elements of the housing parts 33, 34 until the two housing parts 33, 34 are held together only via the rotating element 35 and the slotted guide track 36. Now the upper housing part 33 may be pushed upwards in relation to the lower housing part 34 along the length 37 until the rotating element 35 is positioned in the region of the opening 39 of the slotted guide track 36. Next, the upper housing part 33 may be pulled from the lower hosing part 34 in a substantially horizontal movement, with the rotating element 35 passing through the opening 39.

Attaching or placing the upper housing part 33 to or onto the lower housing part 34 is done in reverse order. First, the upper housing part 33 is positioned above the lower housing part 34 in a slightly inclined way in relation to the lower housing part 34, so the opening 39 of the slotted guide track 36 and the rotating element 35 are aligned with each other. In this way, the upper housing part 33 may now be pushed onto the lower housing part 34, so the rotating element 35 is inserted into the slotted guide track 36 via the opening 39. By performing a vertical displacement, the rotating element 35 is positioned in such a way that the upper housing part 33 is placed on top of the lower housing part 34 via a pivoting movement.

For the sake of completeness, it should be noted that the slotted guide track 36 may also be arranged on the lower housing part 34, and accordingly the rotating element 35 may be arranged on the upper housing part 33. In order to prevent the upper housing part 33 from falling down during pivoting in such a design, the slotted guide track 36 is formed such that, again, the upper part 33 has to be lifted for removal before it is possible to pull it off. Of course, it is permissible to create a design in which the rotating element 35 and the slotted guide track 36 are arranged in the lower regions of the housing part 33, 34 and thus the upper region needs to be pivoted for removal. In this case, it is again important to design the slotted guide track 36 accordingly, so the upper housing part 33 cannot fall down during pivoting. The detachment of the two housing parts 33, 34 should always be done such that first a rotating movement (pivoting) and then a linear movement (lifting) is carried out.

As modern inverters 1 usually contain adjusting capabilities and display elements, electronic components are arranged within the upper and the lower housing parts 33, 34 in most cases. An automatic contact-making between the electronic components of the upper and the lower housing parts 33, 34 is desirable to take place when joining the two housing parts 33, 34. When using automatic contact-making systems 40 of the prior art, a linear movement of the two housing parts 33, 34 in relation to each other is made.

In the inverter 1 according to the invention, automatic contact-making is done during a rotating movement of the housing parts 33, 34 around the axis of rotation of the rotating element 35. For this, an appropriate contact-making system 40, which is illustrated in detail in FIGS. 4 to 8, is arranged within the inverter 1.

The embodiment illustrated in FIGS. 4 to 8 is a single element 41 of the contact-making system 40. The single element 41 may be assembled to form any terminal block, with at least one, but preferably two, guiding protrusions 44 being arranged on a side wall 42 of a housing 43 of electrically insulated design, and corresponding guiding grooves (not shown) being arranged on an opposite side wall 45 for said purpose. In this way, multiple single elements 41 may be joined, as is already known from the prior art. For the sake of completeness, however, it should be noted that the contact-making system 40 may also be formed by one larger block, i.e. be comprised of one part.

It is also possible to combine different designs of the single elements 41, in particular the housings 43, with one another. For example, elevations (not shown) for attaching to a PCB, which are combined with the shown single elements 41 in certain distances, may be arranged on the supporting surface 46 of some single elements 41, so that the block formed therefrom may be easily attached to a PCB.

The contact-making system 40, in particular the single element 41, is a type of terminal block in which a contact element 47 is arranged on one side in a housing 43, and a connecting element 48 for a line or a cable is present on the other side. The contact element 47 and the connecting element 48 are electrically connected to one another.

The connecting element 48 is, for example, fixed by a clamping device 49 for attaching a cable, which can be introduced via an opening 50 in the housing 43 of the contact-making system 40, and then by an attachment means 51, preferably in the form of a screw terminal. As such a design is already well-known from the prior art, the mechanical build-up will not be dealt with in more detail.

The contact element 47 is designed for receiving a correspondingly designed contact tab 52. The contact tab 52 may be inserted into the contact element 47 via a pivoting movement and/or a rotating movement. For this, the contact element 47 is designed openly or freely accessible on the side opposite the connecting element 48, i.e. the front face 53 of the housing 43, so the contact tab 52 can be inserted into the contact element 47 in a trajectory in the shape of a circle arc. The contact element 47 is formed by at least one, in particular two, spring contact(s) 55. Here, a preferably rectangular recess 54 is arranged within the housing 43, in particular a slot in which the at least one spring contact 55 is arranged. The spring contacts 55 are spaced apart from each other far enough for the contact tab 52 to be inserted therebetween. The spring contacts 55 are arranged in a standing position, i.e. in an angle of in particular 90° to the supporting surface 46, within the housing 43, so the contact tab 52 may be inserted into the recess 54 from above in a circular trajectory. In the exemplary embodiment shown, an opening 50, in particular for receiving the cable, is arranged in an angle of approx. 90° to the connecting element 48. In this way, the contact tab 52 can be inserted from above and via the open front face 53 in a trajectory in the shape of a circle arc. In order to achieve a secure contacting, the spring contacts 55 are preferably designed with spring-loaded protruding elevations 56, which are deformed and/or pressed into corresponding recesses when the contact tab 52 is introduced.

The contact-making system 40 described in FIGS. 4 to 8 is integrated into the inverter 1 of FIGS. 2 and 3. For this, the contact tabs 52 are arranged on the upper housing part 33. The contact tabs 52 are preferably attached to a PCB or connected to a corresponding part of a terminal by connecting terminals for wires, and protrude in the direction of the lower housing part 34. In the lower housing part 34 of the inverter 1, single elements 41 of the contact-making system 40 corresponding to the contact tabs 52 are assembled to form a common terminal block and attached accordingly.

In this way, an inverter 1 with an upper and a lower housing part 33, 34 is created, wherein electronic components are arranged in the upper and lower housing parts 33, 34, said components being electrically connected to one another by means of a contact-making system 40 formed from two parts. The upper housing part 33 is connected to the lower housing part 34 in a manually detachable manner by means of a rotating element 35, wherein the rotating element 35 forms an axis of rotation for a circle arc 58, as indicated schematically by dashed lines. In the upper and lower housing parts 33, 34, parts of the contact-making system 40 are arranged, respectively, along this circle arc 58 in such a way that these parts of the contact-making system 40, during a pivoting movement of the upper housing part 33 relative to the lower housing part 34 into an operating position, can be automatically electrically-connected, with the housing parts 33, 34 connected. Of course it is also possible not only to connect housing parts 33, 34 and the contact-making system 40 to one another by means of the rotating element 35, but also to couple individual devices with each other in such a way that data and/or signals are exchanged via the contact-making system 40 and a transfer of power can take place as well. This means that the housing parts 33, 34 may be replaced by devices with housings designed such that they can be coupled with each other accordingly. Furthermore, it is possible to connected multiple, for example three, housing parts or devices that are arranged on top of each other by means of this system.

Basically, the contact tabs 52 may be arranged in a housing with a connecting element 48 that is connected in an electrically conducting manner, as has been described for the spring elements 55. In the contact-making system 40, at least one single element 41 with the spring contacts 55 is arranged in a housing part 33, 34 or a device, and a corresponding contact tab 52 is arranged in the other housing part 33, 34 or device. Corresponding connecting elements 48, for example in the form of terminal strips with plugs and jacks for transferring power and signals, may be mounted and wired accordingly in the two mechanical components.

Such a design may also be used in other areas, in particular in welding technology or for battery-charging devices. Here, a front panel of a welding device or a battery-charging device, on which a wide variety of control elements, adjusting elements and display elements is arranged, may be connected to the housing of the welding element or the battery-charging element in a pivotable manner via a rotating element, for example, as has been described before. Moreover, such a construction may, of course, be used in an electrically isolated inverter as well.

The invention claimed is:

1. An inverter comprising an upper and a lower housing part, wherein electronic components are arranged in the upper and lower housing parts, said components being electrically connected to one another in a releasable manner by means of a contact-making system formed from two parts, wherein the upper housing part is connected to the lower housing part in a manually detachable manner by means of a rotating element arranged on one of the upper housing part or the lower housing part and a slotted guide track arranged on another of the upper housing part or the lower housing part, such that the upper housing part is detached from the lower housing part by a pivoting movement followed by a linear movement, wherein the rotating element forms an axis of rotation for a circle arc, and wherein in the upper and lower housing parts, parts of the contact-making system are arranged, respectively, along this circle arc in such a way that these parts, during the pivoting movement of the upper housing part relative to the lower housing part into an operating position, can be automatically electrically connected, with the housing parts connected.

2. The inverter according to claim 1, wherein the slotted guide track extends linearly in a longitudinal direction of the upper housing part for a defined length according to a diameter of the rotating element and then extends to the outside in an angular manner, thus forming an opening for receiving the rotating element.

3. The inverter according to claim 1, wherein at least one single element is arranged in one of the upper housing part and the lower housing part, and at least one corresponding contact tab of the contact-making system is arranged in another of the upper housing part and the lower housing part.

4. The inverter according to claim 3, wherein a contact element is arranged on one side of a housing of the single element of the contact-making system, and a connecting element for a line or a cable is arranged on another side of the housing, and the contact element and the connecting element are connected to one another.

5. The inverter according to claim 4, wherein the contact element is open on a front face of the housing opposite the connecting element for receiving the contact tab.

6. The inverter according to claim 4, wherein the contact element is formed by at least one spring contact, wherein a rectangular recess for arrangement of the at least one spring contact is arranged in the housing.

7. The inverter according to claim 6, wherein the spring contacts are arranged standing; at an angle of substantially 90° to a supporting surface within the housing, so the contact tab may be inserted into the contact element from above in a circular trajectory.

* * * * *